(12) United States Patent
Koe

(10) Patent No.: US 6,480,980 B2
(45) Date of Patent: *Nov. 12, 2002

(54) COMBINATIONAL TEST PATTERN GENERATION METHOD AND APPARATUS

(75) Inventor: Wern-Yan Koe, San Jose, CA (US)

(73) Assignee: NEC Electronics, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/265,513

(22) Filed: Mar. 10, 1999

(65) Prior Publication Data

US 2002/0133775 A1 Sep. 19, 2002

(51) Int. Cl.[7] .............................................. G01R 31/28
(52) U.S. Cl. ....................................................... 714/738
(58) Field of Search ................................ 714/738, 736, 714/731, 45, 47, 724, 726, 733, 27; 702/59; 708/254; 710/108, 107, 100, 14, 306; 700/6; 455/26.1; 703/14, 15, 22

(56) References Cited

U.S. PATENT DOCUMENTS

| | | | | |
|---|---|---|---|---|
| 4,630,270 A | * | 12/1986 | Petit et al. ..................... 714/45 |
| 5,444,715 A | * | 8/1995 | Gruetzner et al. ........... 714/727 |
| 5,524,217 A | * | 6/1996 | Sone et al. ................... 710/108 |
| 5,640,402 A | * | 6/1997 | Motika et al. ............... 714/731 |
| 5,642,362 A | * | 6/1997 | Savir ........................... 714/726 |
| 5,805,789 A | * | 9/1998 | Huott et al. .................... 714/7 |
| 6,199,182 B1 | * | 3/2001 | Whetsel ....................... 714/724 |

OTHER PUBLICATIONS

NN881089101(Latch–to–Latch Delay Testing in LSSD Using a Three–Latch SRL; IBM Technical Disclosure Bulletin, Oct. 1988, US; vol. No.: 31, Issue No.: 5, p. No.: 89 95).*

NA78044369(Skewed Loading of LSSD Shift Register Chains for Enhancing Test Generation; IBM Technical Disclosure Bulletin, Apr. 1978, US; vol. No.: 20, Issue No.: 11A, p. No.: 4369–4370).*

NN9310249(Timing Verification Algorithm for Clock Design with Slack Stealing; IBM Technical Disclosure Bulletin, Oct. 1993, US; vol. No.: 36, Issue No.: 10, p. No.: 249–254).*

(List continued on next page.)

Primary Examiner—Albert Decady
Assistant Examiner—Guy Lamarre
(74) Attorney, Agent, or Firm—Campbell Stephenson Ascolese LLP

(57) ABSTRACT

A method and apparatus that couple a change input scan chain test pattern with an initialization scan chain test pattern such that a resultant scan chain test pattern is produced, and apply the resultant scan chain test pattern to at least one combinational logic path. In one embodiment, the coupling is achieved by interleaving the change input scan chain test pattern with the initialization scan chain test pattern. In another embodiment, the coupling is achieved by creating a constructed test pattern set from the change input and the initialization scan chain test pattern.

26 Claims, 17 Drawing Sheets

OTHER PUBLICATIONS

Digital Systems Testing and Testable Design Textbook, Abramovici et al., 1990; Chapters 2–3.*

NA9001256: (Instruction Fetch Address Implementation; IBM Technical Disclosure Bulletin, Jan. 1990).*

Savir, J. et al.(Scan–based transition test; IEEE, Aug. 1993).*

Kishinevsky, M et al (Partial scan delay fault testing of asynchronous circuits; IEEE, Nov. 1998).*

Kishinevsky, M et al (Partial scan delay fault testing of asynchronous circuits; IEEE, Nov. 1997, Abstract).*

Einspahr et al. (Improving circuit testability by clock control; IEEE, Mar. 23, 1996).*

Mehta, S.K. et al.(Synthesis for testability by two–clock control; IEEE, Jan. 7, 1997).*

Pomeranz, I. et al.(A test application scheme for embedded full–scan circuits to reduce testing costs; IEEE, Nov. 27, 1992).*

* cited by examiner

COMBINATIONAL TEST PATTERN GENERATION METHOD AND APPARATUS

BACKGROUND OF THE INVENTION

1. Field of the Invention

This invention relates to the field of integrated circuit testing.

2. Description of the Related Art

An integrated circuit (IC) is a miniature electric circuit containing large numbers of discrete electronic circuit elements, such as transistors, resistors, capacitors, and diodes, which are packaged as a single unit with leads extending from it for input, output, and power-supply connections. The electronic circuit elements are formed by selective manipulation of a single chip of semiconductor material, often in combination with various other semiconducting and/or conducting materials.

It is common in the art to roughly classify integrated circuits dependent upon their transistor density. Presently, there are effectively four common integrated circuit classifications: small-scale integrated circuits (SSIs); medium-scale integrated circuits (MSIs); large-scale integrated circuits (LSIs); and very-large-scale integrated circuit (VLSIs). Exactly what transistor densities constitute the various "classes" varies, but at present SSIs typically include up to several tens of transistors, MSIs include from many tens to several hundred transistors; LSIs include from several hundred to a few thousand transistors; and VLSIs several hundred thousand or more. Most ICs in use today would constitute VLSIs.

One powerful feature of integrated circuits is the ability to use such integrated circuits to produce several levels of abstraction, which is useful for complete design. For example, integrated circuit design can be viewed at one level of abstraction in terms of discrete electronic circuit components (e.g., resistors, capacitors, inductors, transistors, diodes, etc.). Integrated circuit design can also be viewed at a next-higher layer of abstraction in terms of logic diagrams consisting of well-defined digital Boolean logic circuits such as AND, NAND, OR, and NOR gates, where each such gate consists of well-defined congeries of the discrete electronic circuit elements. Integrated circuit design can also be viewed at yet a next-higher layer of abstraction known as Register Transfer Level (RTL), which consists of program-like statements describing the movement or processing of data between storage elements. Integrated circuits can also be viewed at a yet again higher layer of abstraction known as a functional block diagram layer, which shows the major subcomponents of a design. This is the level at which the highest conceptual design work is done.

Typically, IC design is done at the functional block diagram, RTL, and logic diagram levels. It is common for whole teams of people (and sometimes whole companies) to focus on various aspects of the design at various abstraction levels. However, as noted, the design process rarely proceeds at a lower level than that of logic diagrams. Below this level, it is common to program the desired logic diagram layouts into artificially intelligent software, which automatically produces discrete circuit component level diagrams to be enacted within the integrated circuit.

As noted above, the discrete circuit level components are produced via the selective manipulation of a single piece of semiconductor material, where such selective manipulation usually includes the use of other semi-conducting and/or conducting materials. The discrete circuit level components are created via this selective manipulation.

The regions affected by the selective manipulation of the single piece of semiconductor material are almost unimaginably small. For example, current VLSI production procedures produce the discrete circuit components by manipulating material by use of sub-micron width (i.e., widths of less that (1/1,000,000) of a meter) lines drawn, or "etched," in the semiconductor material. Furthermore, the sizes of the regions manipulated decrease virtually every week.

Due to the very small regions manipulated during VLSI production, errors invariably occur. This can be the result of contamination of the material, or minor variations in the length, width, or height of lines etched. These errors in production often result in errors in the behavior of the discrete electronic circuit level components.

As noted, the higher abstraction logic diagram level is designed using logic diagram level component circuits consisting of congeries of discrete circuit level components. Consequently, errors in production sufficient to produce errors in the behavior of the discrete circuit level components can "propagate" upwards to the logic diagram level since the logic diagram circuits are built from congeries of these malfunctioning circuit components. If the errors are severe, then such malfunctioning will be very apparent in that the affected logic diagram level circuits will not function. However, if the malfunction is not severe, it is possible that the affected logic diagram level components will perform, but will perform in such a way that is out of design tolerances, which can cause a general system malfunction or failure as these logic diagram level errors "propagate" up the abstraction-layer hierarchy to affect the RTL and functional block diagram level designs.

A principal way in which such a malfunction will manifest at the logic diagram level is that one or more of the logic diagram level circuits will perform their functions appropriately, but so slowly that they affect the design. Accordingly, testing has been devised in the art to ensure that the logic diagram level circuits are performing their functions within design tolerances. This testing basically amounts to the following: (1) defining at least one combinational logic path through a combinational logic circuit; (2) initializing the combinational logic circuit with a given set of inputs; (3) waiting until the combinational logic circuit becomes stable; (4) changing the logic levels of one or more of the set of inputs; and (5) and measuring the time it takes for output of the combinational logic circuit at the end of the defined path to change subsequent to the change in the set of inputs.

With reference now to FIGS. 1A, 1B, and 1C, shown is combinational logic circuit 100 composed of logic diagram level circuits 108, 110 which will be utilized to illustrate how delay testing of combinational logic diagram circuits is achieved in the related art. The diagrams in FIGS. 1A, 1B, and 1C show a combinational logic path that implements the equation output signal Z=(input signal a*input signal b)+input signal c, with the path from input signal a to output signal Z, whose delay is to be measured, illustrated by the heavier dark line segments of path 102, 104, 106. As described above, two input signal test patterns are needed to measure the delay path: a first input signal test pattern to initialize output signal Z, and a second input signal test pattern to cause a change in output signal Z from that to which it was previously initialized.

Depicted is that feeding combinational logic circuit 100 is scan chain register bank 101 composed of Registers a, b, and c. As has been discussed, scan chain test patterns need to be utilized to test the delay associated with path 102, 104, 106. Such scan chain test patterns are typically generated by recognizing that the various logic circuits providing inputs to the path whose delay is to be tested generate certain requirements relevant to such scan chain patterns. For example, regarding AND gate 108, in the context of controlling the value of output Z, those skilled in the art will recognize that a non-controlling logic value is logic 1. Furthermore, those skilled in the art will also recognize that, in the context of controlling of output Z, a non-controlling value is logic 0 for OR gate 110. Consequently, to test the delay of path 102, 104, 106 both input signals from Register b and input signal from Register c should stay at non-controlling values, while input signal from Register a should change from logic value 0 to logic value 1, or change from logic value 1 to logic value 0, in order to force a change in output signal Z. Two examples of test pattern sequences that satisfy the above conditions are as follows: a first test pattern set of ABC=<initialization test pattern of "010", change input test pattern of "110">, or a second test pattern set which is the partial complement of the first test pattern set, ABC=<initialization test pattern of "110", change input test pattern of "010">. The first test pattern set is illustrated in FIG. 1A.

Referring now to FIG. 1B, those skilled in the art will recognize that during the shifting of data through scan chain register bank 101, Register b(t+1)=Register a(t) and Register c(t+1)=Register b(t), where the value t is defined as clock cycle count, which is illustrated as clock cycle waveform 112 in FIG. 1C. For sake of illustration, it will be assumed herein that values are clocked into registers at the leading edge of clock cycles in clock cycle waveform 112. However, those skilled in the art will recognize that multitudinous variants on this scheme are possible.

Illustrated in FIG. 1B is that initialization test pattern "010" has been previously loaded into Registers a, b, and c. This input initializes combination logic path 100 and forces output Z=0. As shown, it is desired to use change input test pattern "110" to test the delay of path 102, 104, 106.

As shown in FIG. 1C, it takes three leading-edge clock cycles before change input test pattern "110" can be fully clocked into Registers a, b, and c. Notice that since during the shifting of data through scan chain register bank 101, Register b(t+1) =Register a(t) and Register c(t+1)=Register b(t), where the value t is defined as clock cycle count, there is no practicable way in which change input test pattern "110" can be clocked into scan chain register 101 in one clock cycle. Rather, on the first leading edge Register a, b, and c contain "001", and on the second leading edge Register a, b, and c contain "101". Thereafter, on the third leading edge change input test pattern "110" is clocked into Registers a, b, and c. Thus, as demonstrated, under the scheme shown, there is no practicable way to apply change input test pattern "110" immediately subsequent to initialization test pattern "010" in that intermediate patterns "001" and "101" must be clocked through Registers a, b, and c in order to get change input test pattern "110" loaded into Registers a, b, and c subsequent to initialization test pattern "010" being loaded.

As the foregoing has shown, under the related art somewhat more than 3 clock cycles must elapse subsequent to initialization test pattern "010" being loaded into scan chain register bank 101 before change input test pattern "110" is loaded. Those skilled in the art will recognize that, due to the foregoing noted difficulties, it is the practice within the related art to design scan chain test pattern sets dependent upon the inputs of any particular circuit under test, which thus severely limits the number of test pattern sets which can be utilized. To use scan chain register bank 101 to illustrate this practice, notice that an initialization test pattern of "111" followed by a "0" could be utilized to apply the change input test pattern "011"; notice also that the complement of the foregoing ("000" followed by a "1") could also be so applied with adequate results.

Notice that the test patterns which may be applied under the related art are wholly constrained by the arrangement of inputs of the combinational logic circuit under test and the fact that the test patterns are sequentially scanned into any scan chain register. Those skilled in the art will recognize that it is quite possible, under the foregoing noted related art constraints, that there will be no scan chain test pattern sets that can be applied to test certain circuits. Those skilled in the art will also recognize that even in those instances under the related art where a circuit under test does allow the construction of test pattern sets which can be practicably applied to the circuit, that the number and type of those test patterns will be a severely constrained subset of all the test patterns that can be envisioned (a fact illustrated in relation to scan chain register bank 101, above).

Those skilled in the art will recognize that it is desirable to have the ability to practicably apply the full range of test pattern sets which may be appropriate to any particular combinational logic circuit under test, such as combinational logic circuit 100. However, it has been demonstrated that under the related art it is not possible to practicably apply the full range of test pattern sets appropriate to a particular combinational logic circuit under test. It is therefore apparent that a need exists in the art for a method and apparatus which will provide the ability to practicably apply the full range of test pattern sets appropriate to any particular combinational logic circuit under test.

SUMMARY OF THE INVENTION

A method and apparatus have been devised which provide the ability to practicably apply the full range of test pattern sets appropriate to any particular combinational logic circuit under test. The method and apparatus couple a change input scan chain test pattern with an initialization scan chain test pattern such that a resultant scan chain test pattern is produced, and apply the resultant scan chain test pattern to at least one combinational logic path. In one embodiment, the coupling is achieved by interleaving the change input scan chain test pattern with the initialization scan chain test pattern. In another embodiment, the coupling is achieved by creating a constructed test pattern set from the change input and the initialization scan chain test pattern.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The following sets forth a detailed description of the best contemplated mode for carrying out the invention as described in the claims. The detailed description is intended to be illustrative and should not be taken as limiting.

Figure 2A:
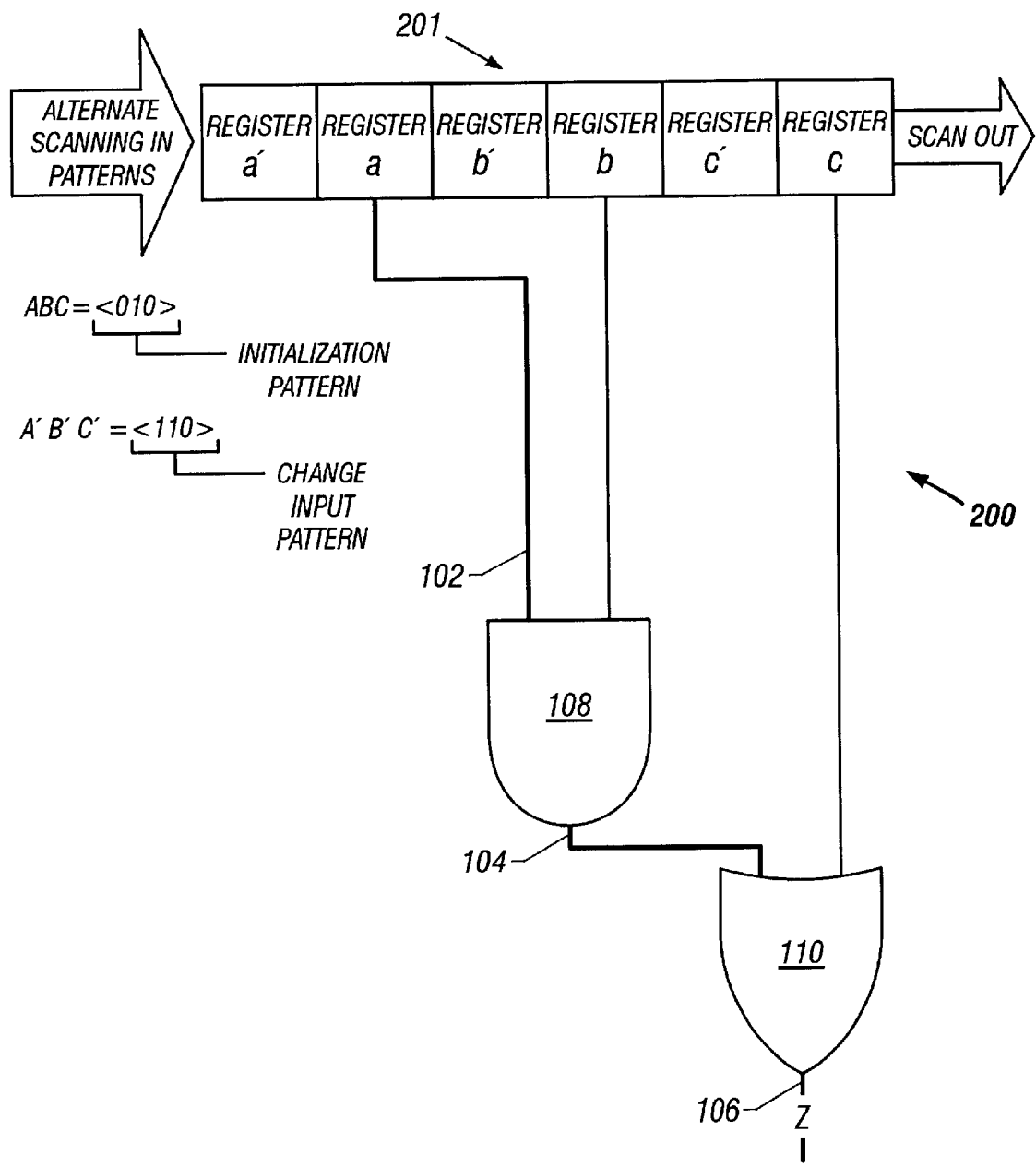
FIGS. 2A, 2B, and 2C illustrate the functioning of embodiments of the present invention wherein shadow registers are utilized.
Figure 2B:
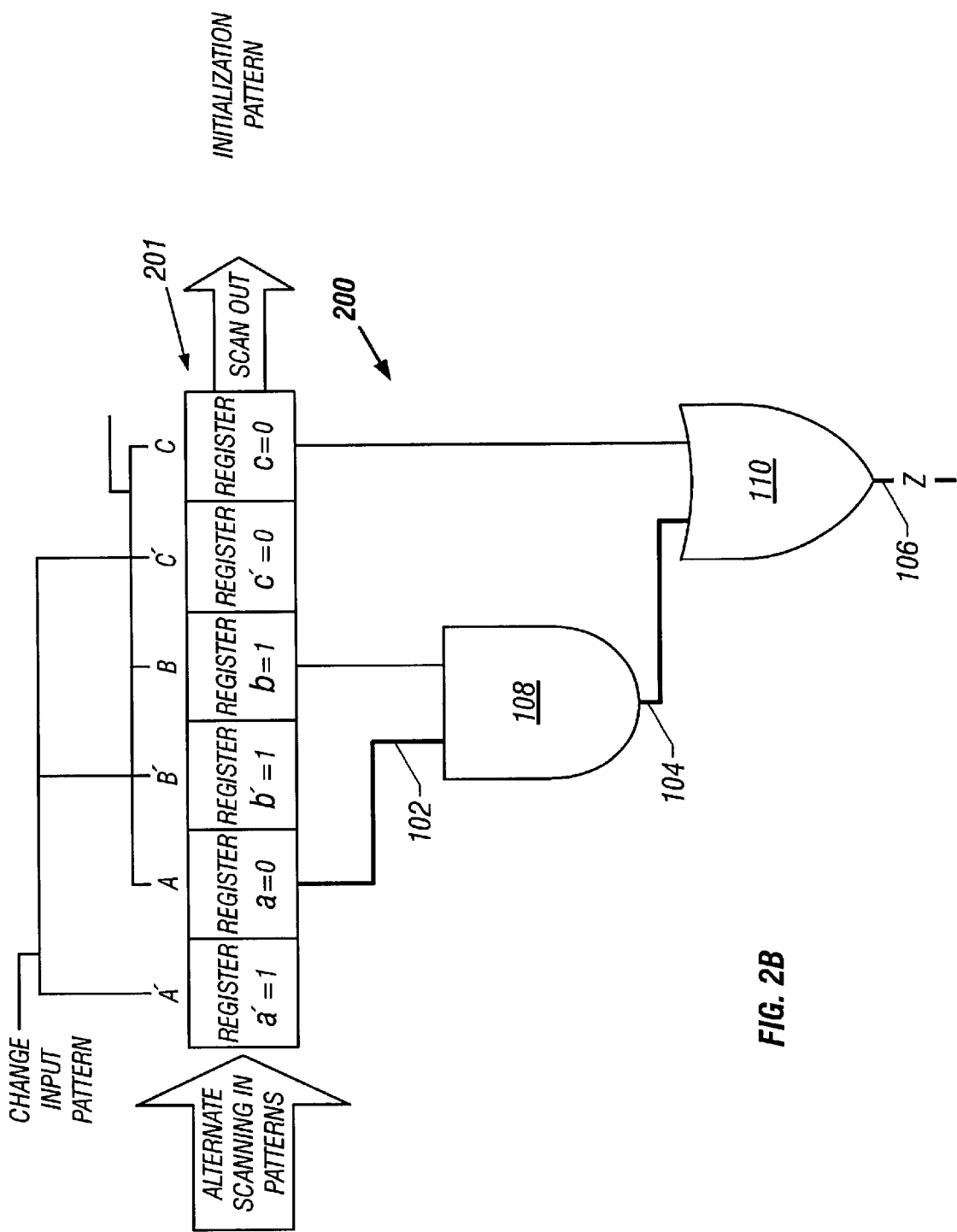
Figure 2C:
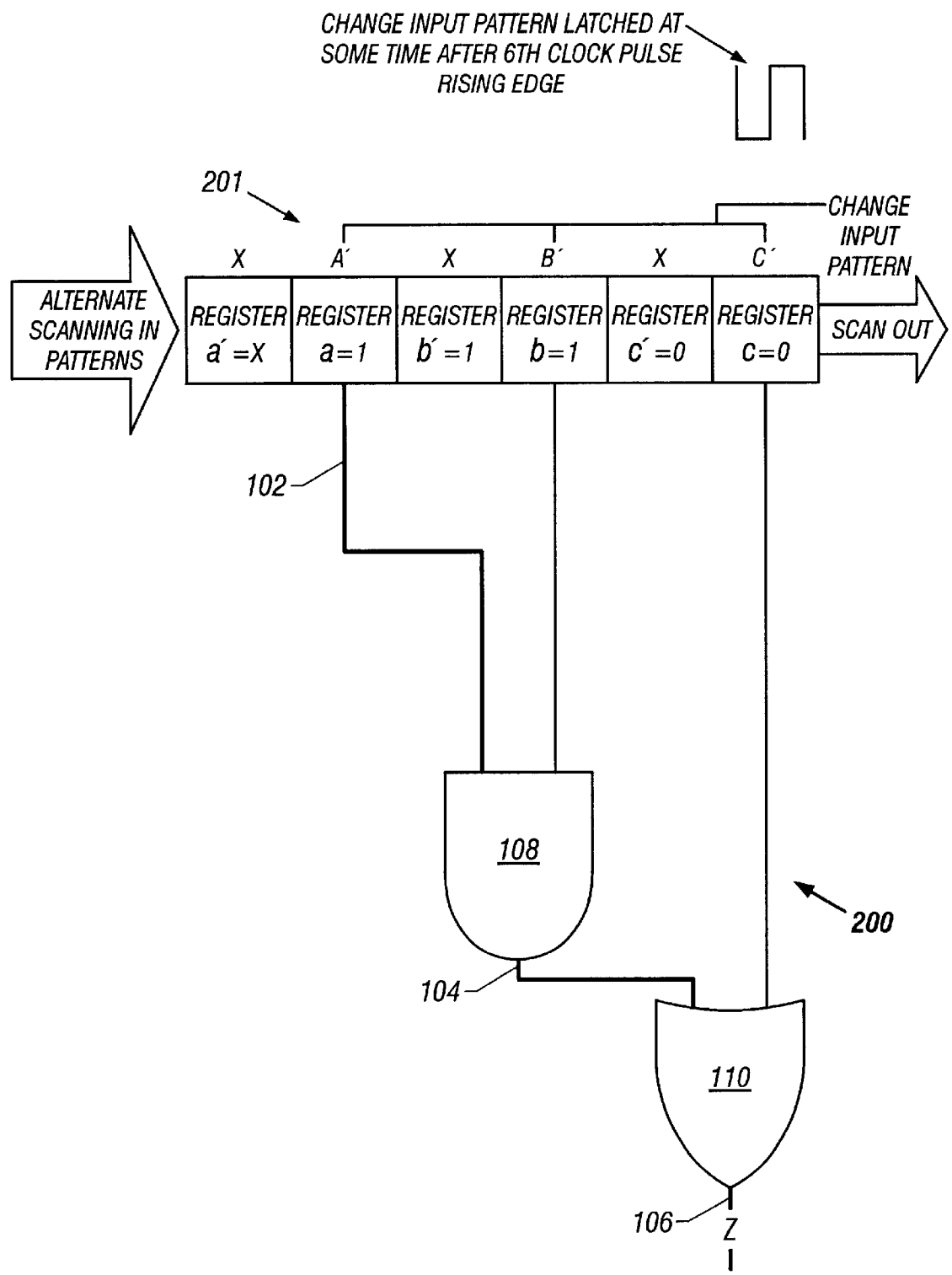

Referring now to FIGS. 2A, 2B, and 2C shown is a combinational logic circuit 200 composed of logic diagram level circuits which will be utilized to illustrate the functioning of embodiments of the present invention. Depicted in FIG. 2A is that shadowed scan chain register bank 201 is feeding combinational logic circuit 200. As shown, shadowed scan chain register bank 201 has Registers a, b, and c of scan chain register bank 101; however, also shown is that shadowed scan chain register bank 201 has "shadow" Register b' inserted between Registers a and b, shadow Register c' inserted between Registers b and c, and shadow Register a' inserted to be the input register, and thus is shown inserted to the left of Register a.

As will be shown in the discussions of FIGS. 2B and 2C, shadow Registers a', b', and c' serve as place-holders for the change input test pattern. It will be understood by those skilled in the art that shadow Registers a', b', and c' should be properly connected to ground to eliminate noise and leakage current. As shown, the outputs of shadow Registers a', b', and c' connect to the scan inputs of following Registers a, b, and c of scan chain register bank 201. As will be shown, in the delay test operation, the shadow registers are utilized to hold the change input test pattern. In the normal operation (that is, when testing is not being performed and an IC of which combinational logic circuit 200 is a part is performing normal, ordinary, non-test functions), the shadow registers a', b', and c' remain inactive. That is, the shadow Registers a', b', and c' are only activated when a testing signal indicates testing is desired. Reference material related to testing signals and other general background material may be located in *M. Abramovici, et al., Digital Testing and Testable Design Textbook*, (1990), which is hereby incorporated by reference herein in its entirety.

Figure 1A:
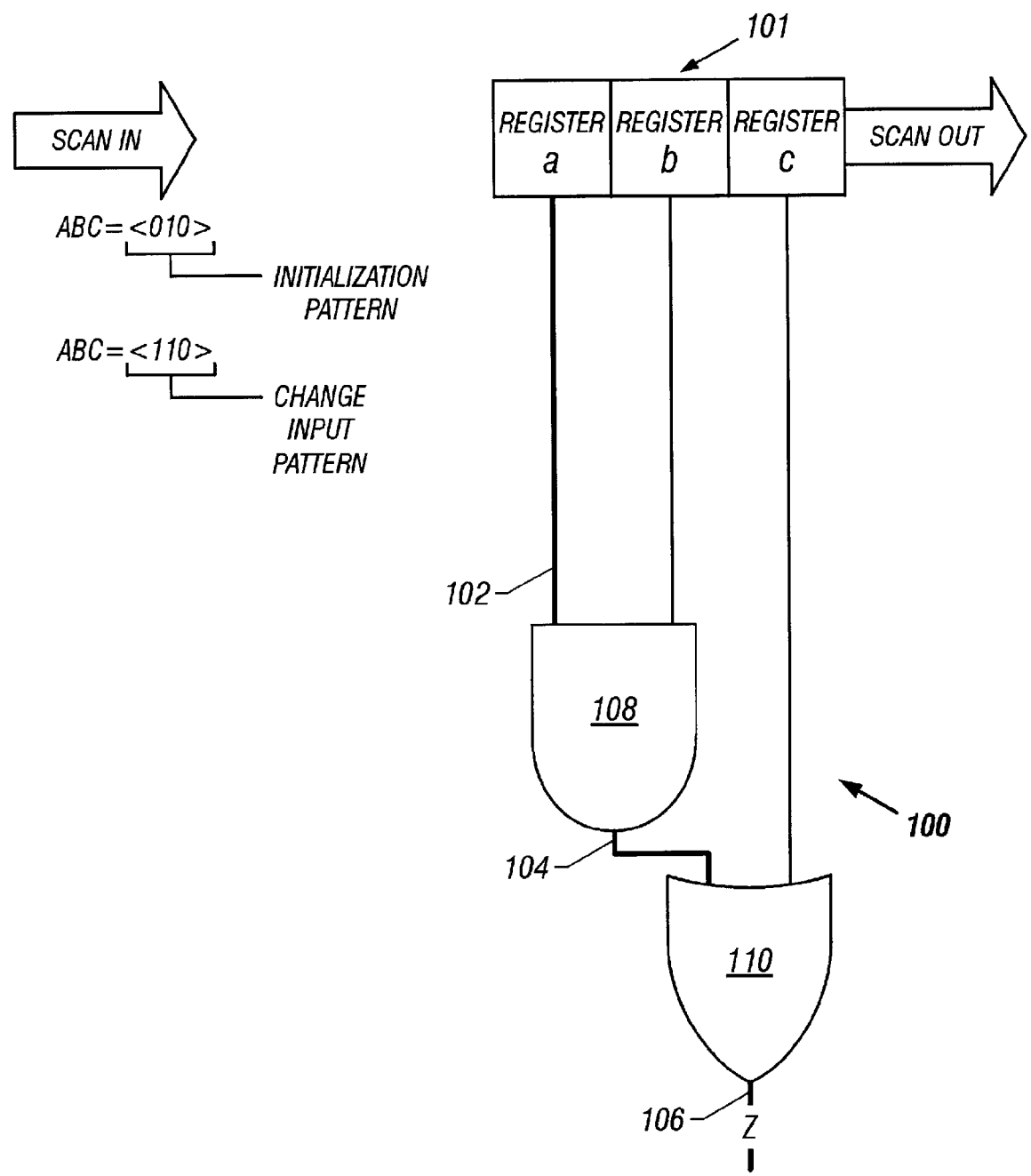
FIGS. 1A, 1B, and 1C illustrate how delay testing of combinational logic diagram level circuits is achieved in the related art.
Figure 1B:
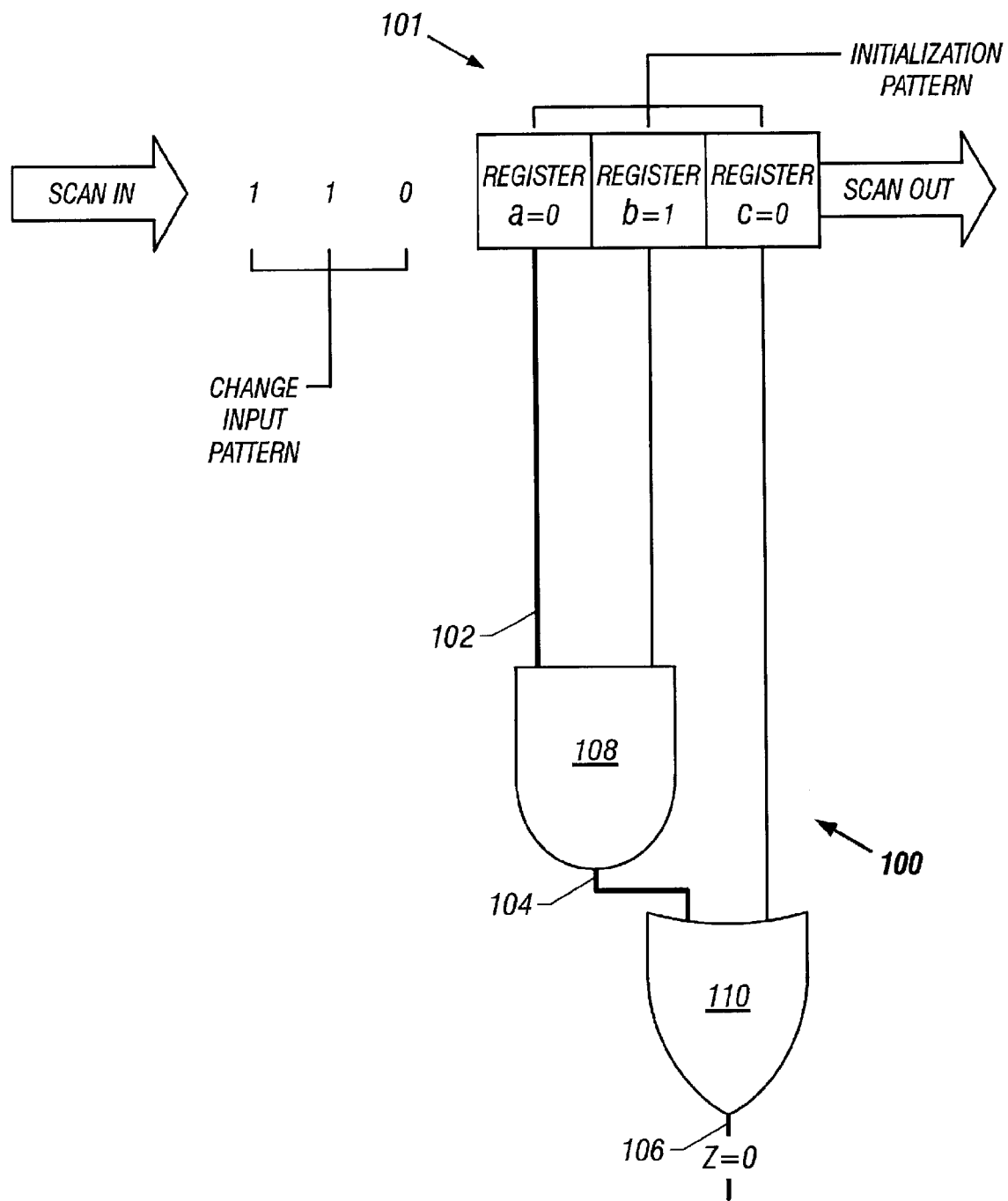
Figure 1C:
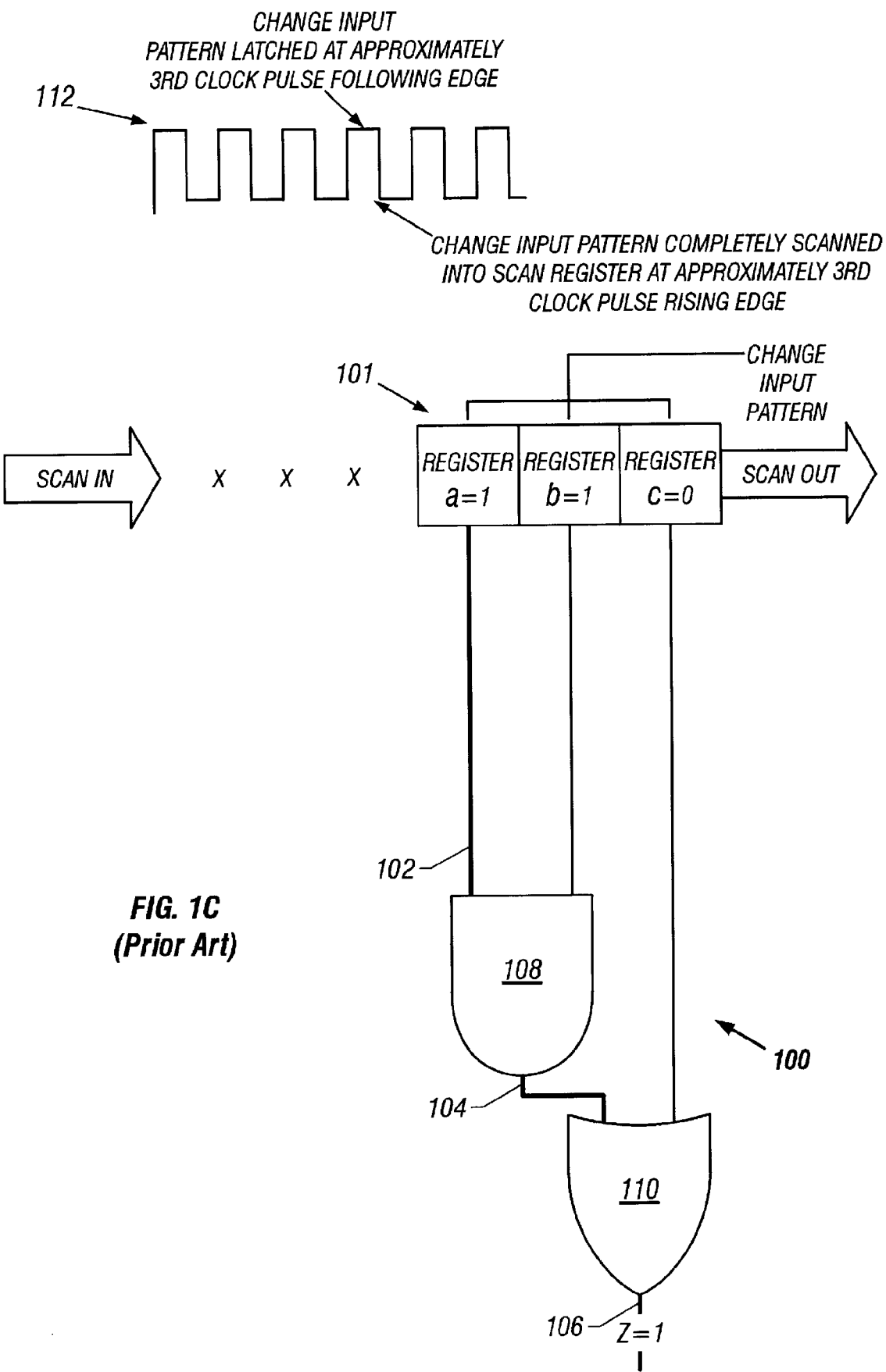

As shown, shadow registers in FIGS. 2A, 2B, and 2C are labeled as Registers a', b', and c'. It is desired to apply the first test pattern sequence of ABC=<initialization test pattern of "010", change input test pattern of "110">, which was discussed in relation to FIGS. 1A, 1B, and 1C wherein it was demonstrated that subsequent to initialization test pattern "010" being loaded, there was no practicable way to follow initialization test pattern "010" with change input test pattern "110" due to the fact that in the absence of the present invention the number and type of scan chain test pattern sets which may be practically applied to a particular combinational logic circuit are severely constrained by the arrangement of inputs to the combinational logic circuit under test and the fact that the test patterns are sequentially scanned into scan chain register 101. The embodiment shown in FIGS. 2A, 2B, and 2C alleviates the foregoing noted constraints and makes it possible to practicably apply virtually any imaginable test pattern set.

Referring now to FIG. 2B, shown is that initialization test pattern "010" and change output test pattern "110" have been alternately clocked in such that shadowed scan chain register bank 201 now contains contents of the sequence A'AB'BC'C=<101100> (where A, A', B, B', C, C' refer to the respective components of initialization test pattern ABC= "010" and change input test pattern A'B'C'="110" as depicted in FIG. 2A). As shown, in the current clock cycle, initialization test pattern "010" is held in Registers a, b, and c.

With reference now to FIG. 2C, depicted is that on the next clock cycle rising edge, the logic value A' is shifted into Register a, the logic value B' is shifted into Register b, and the logic value C' is shifted into Register c. Thus, the embodiment shown gives the ability to apply change input test pattern "110", subsequent to the application of initialization test pattern "010" in just one clock cycle. Thus, the embodiment shown allows the use of test pattern sequence ABC=<initialization test pattern of "010", change input test pattern of "110">, to control the inputs to combinational logic circuit 200 such that the time delay on path 102, 104, 106 can be measured—something not possible under the related art, as was explained above.

Those skilled in the art will recognize that the embodiment shown will allow the sequential application of any initialization test pattern-change input test pattern sets appropriate to combinational logic circuit 200. For example, as an additional embodiment, those skilled in the art will recognize that the test pattern set of ABC=<initialization test pattern "110", and change input test pattern "010">, can also be achieved using the embodiment shown in FIG. 2A by applying the data set A'AB'BC'C=<011100> in a fashion substantially similar to that just described in relation to FIGS. 2A and 2B.

The above examples show how the delay of path 102, 104, 106 can be tested using shadow registers. Those skilled in the art will appreciate that the shadow registers can be inserted for any arbitrary path, and that the embodiments shown and discussed in relation to FIGS. 2A, 2B, and 2C can be extended from more than two successive patterns by the insertion of more shadow registers in a fashion analogous to that shown in for shadow Registers a', b', and c'. Those skilled in the art will recognize that Registers a', a, b', b, c', and c can be implemented utilizing any number of components well known to those within the art, such as virtually any memory elements allowing the sequential application of data (e.g., flop flops, latches, or random access memory sequentially employed) to appropriate inputs of any particular combinational logic circuit under test.

The embodiments illustrated with the help of FIGS. 2A, 2B, and 2C assumed that additional shadow registers would be inserted in addition to those registers normally utilized for the operation of an IC. However, other embodiments exist which will provide essentially the same functionality of the embodiments shown in relation to FIG. 2, but without requiring any additional registers beyond those already present in an IC.

Figure 3A:
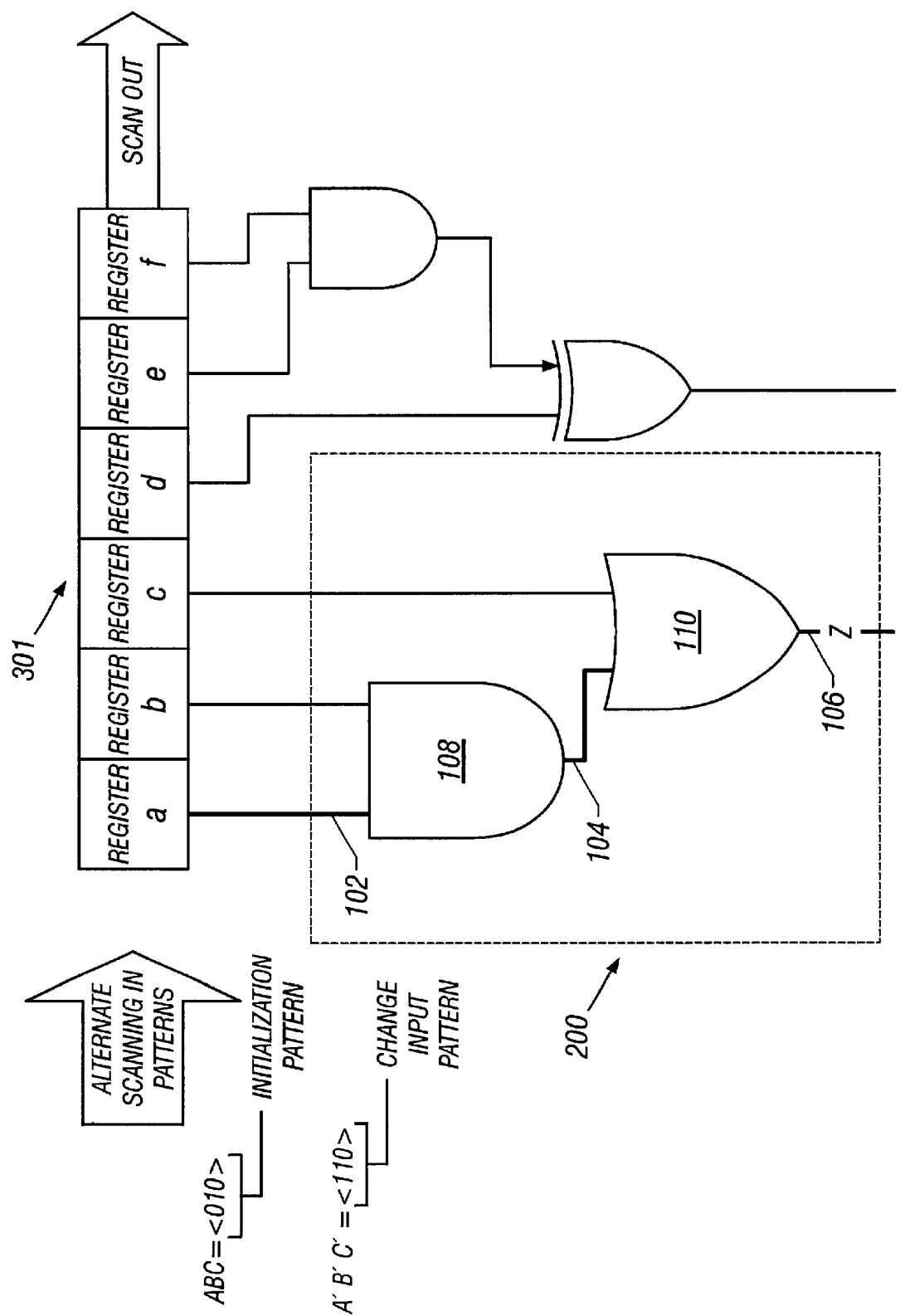
FIGS. 3A, 3B, and 3C, 3D and 3E illustrate embodiments of the present invention which will provide the advantage of the embodiments of FIGS. 2A, 2B, and 2C, but which utilize preexisting IC registers to provide the functions of shadow registers.

Referring now to FIGS. 3A, 3B, 3C, 3D, and 3E shown is a partially schematic diagram which will be utilized to illustrate embodiments of the present invention which will provide the advantage of the embodiments of FIGS. 2A, 2B, and 2C, but which utilize pre-existing IC registers to provide the functions of shadow Registers a', b', and c'. Shown in FIG. 3A is scan chain register bank 301, which as shown contains Registers a, b, c, d, e, and f. As shown in FIG. 3A, it is desired to test the delay of path 102, 104, 106 utilizing test pattern ABC=<initialization test pattern of "010", and change input test pattern of "110">in such a fashion as that illustrated in relation to FIGS. 2A, 2B, and 2C. However, as shown, no shadow registers exist within scan chain register bank 301. Depicted, though, is that other registers (Registers d, e, and f) serving circuit elements other than those of combinational logic circuit 200 do exist.

Figure 3B:
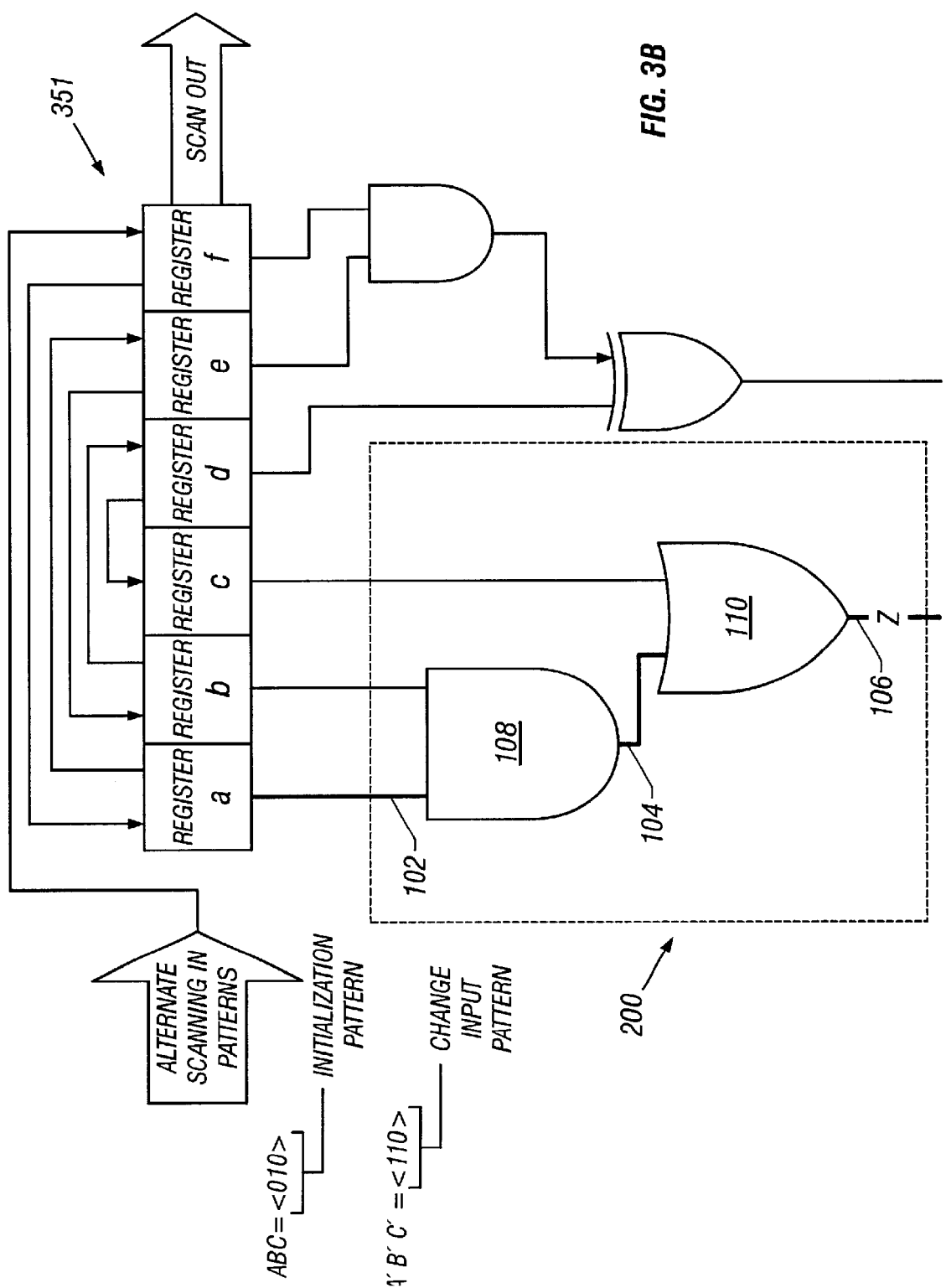

With reference now to FIG. 3B, it can be seen that Registers d, e, and f can be interconnected with Registers a, b, and c such that composite shadowed scan chain register bank 351 is constructed which will function "as if" shadow registers are present. Shown is that connections have been made such that that composite shadowed scan chain register bank 351 is constructed with Register f as the first register, Register a as the second register, Register e as the third register, Register b as the fourth register, Register d as the fifth register, and Register c as the sixth register.

Figure 3C:
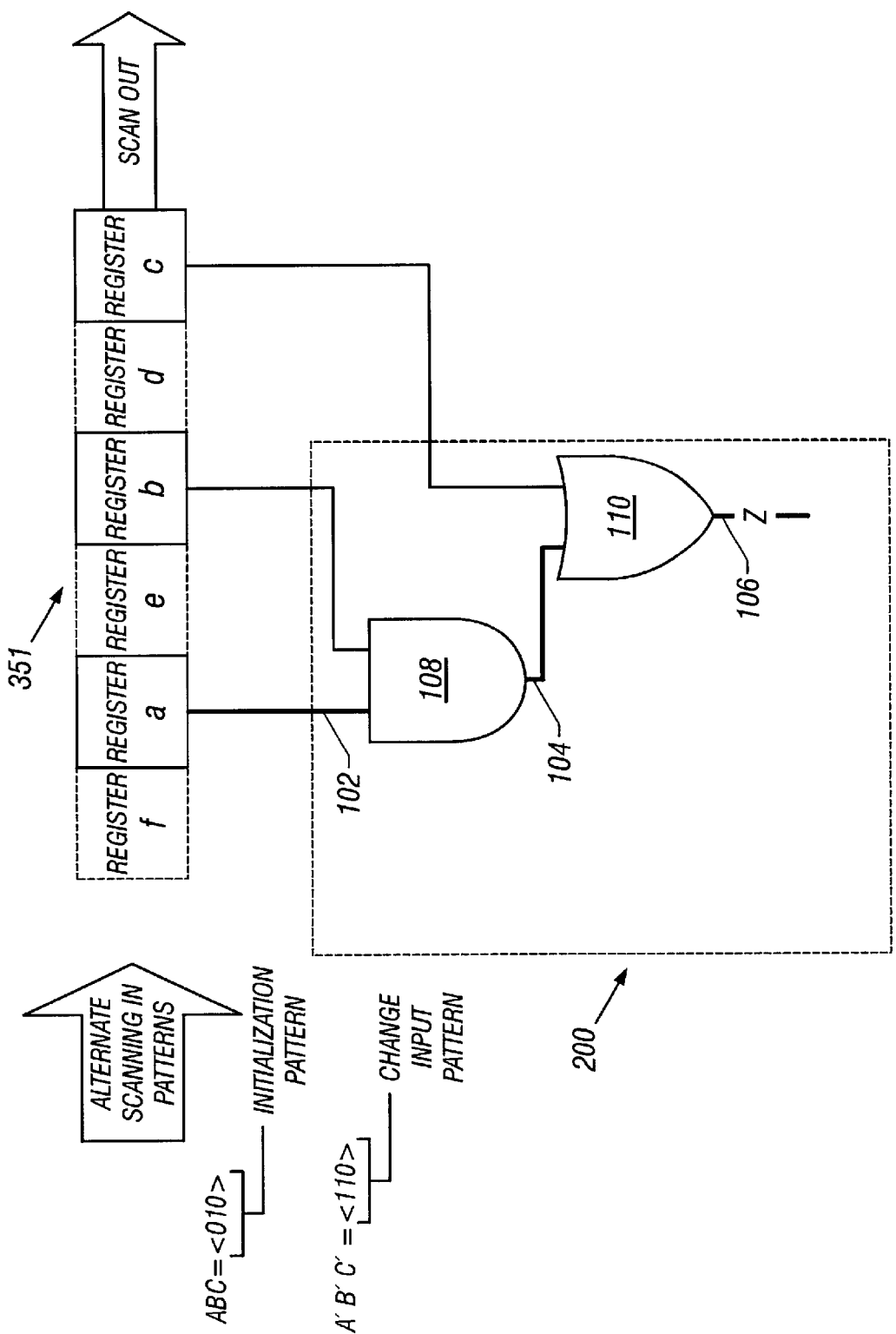

Referring now to FIG. 3C, shown is the logical ordering of composite shadowed scan chain register bank 351 arising from the connections shown in FIG. 2C. Comparison of the logical ordering of composite shadowed scan chain register bank 351 with shadowed scan chain register bank 201 will reveal that they are substantially similar, but that in composite shadowed scan chain register bank 351 Registers f, e, and d "play the role" of shadow Registers a', b', and c' of shadowed scan chain register bank 201, respectively.

Figure 3D:
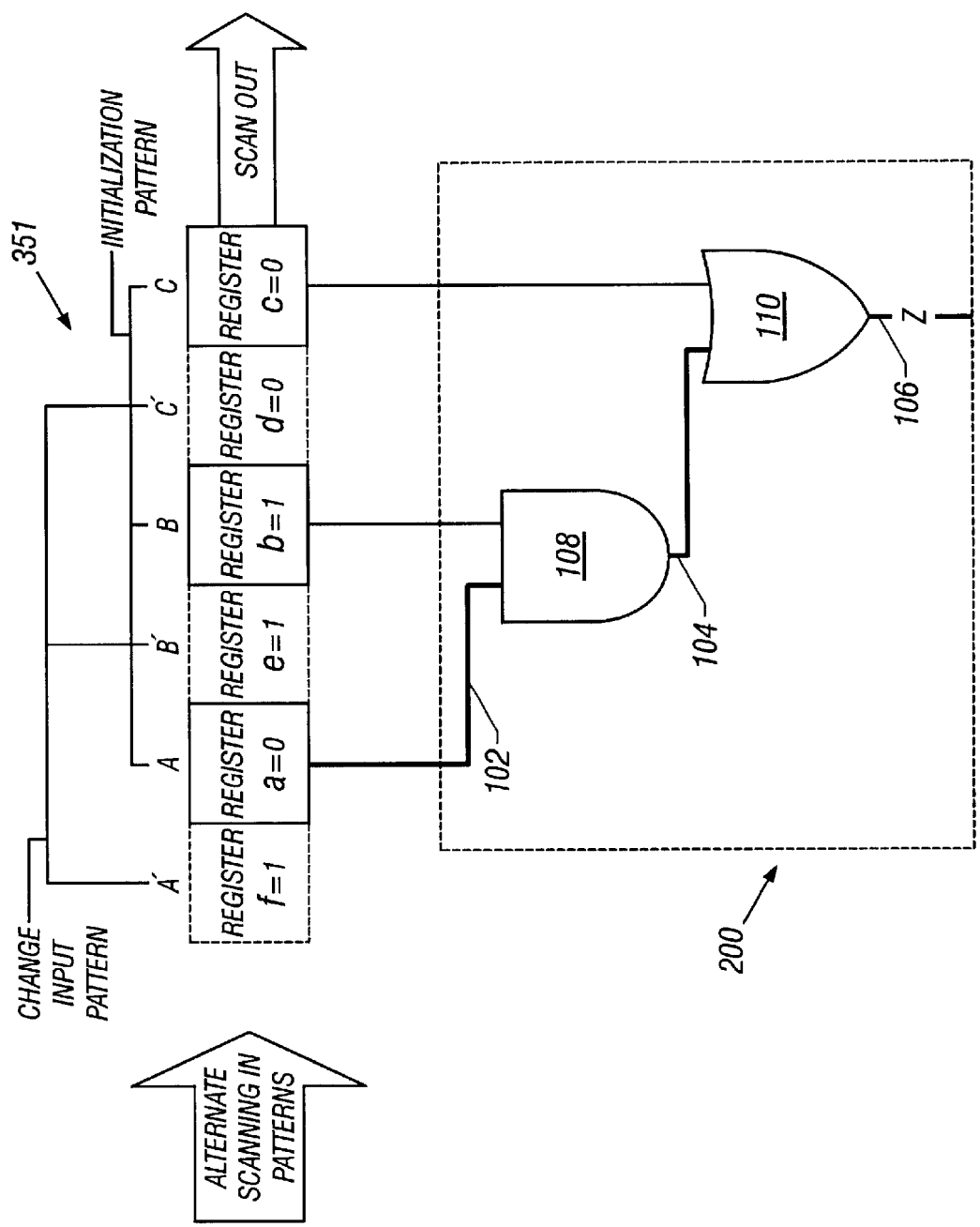
Figure 3E:
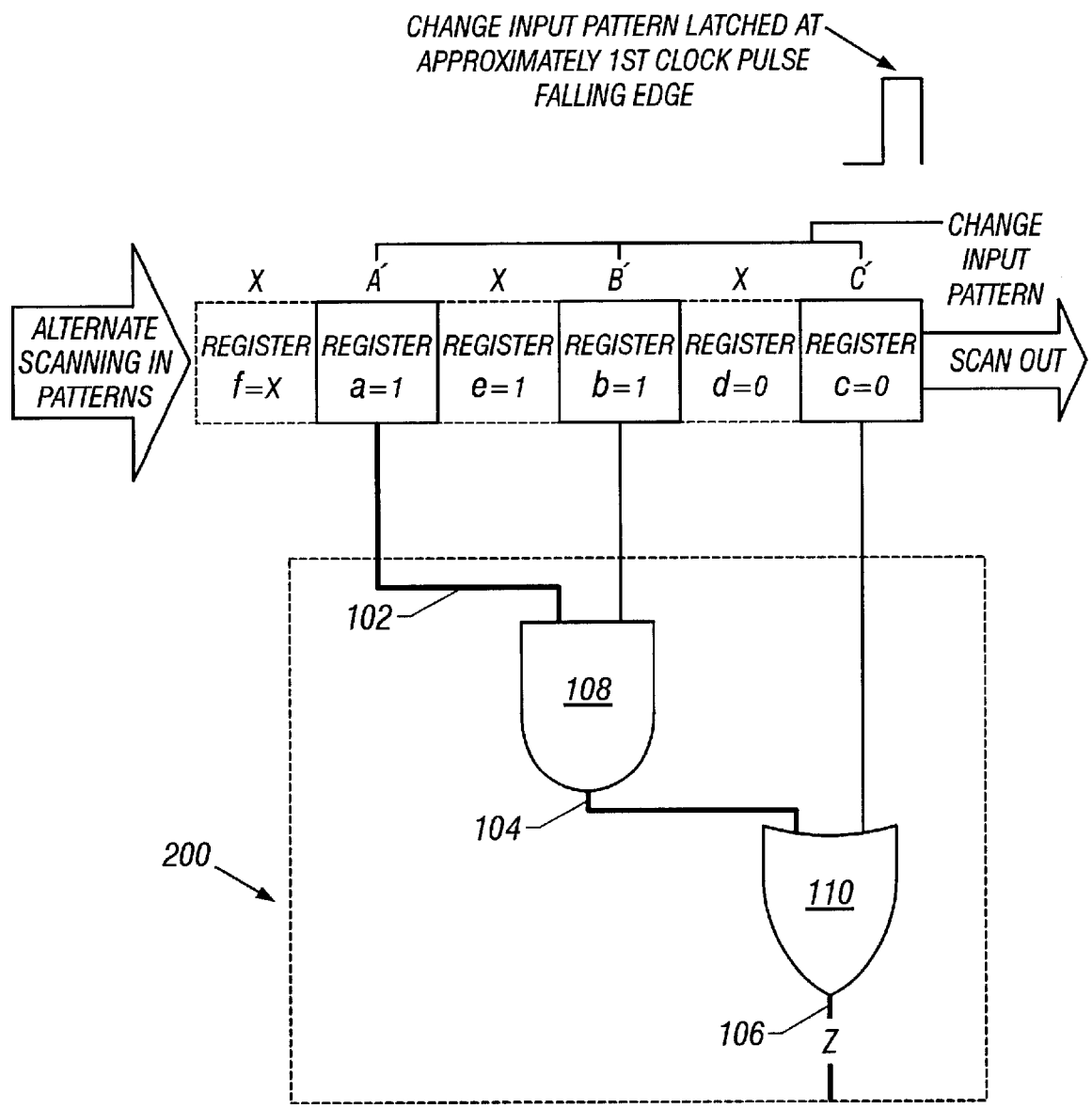

With reference to FIG. 3D, depicted is composite shadowed scan chain register bank 351 which shows the logical ordering of FIG. 3C and wherein initialization test pattern "010" and change input test pattern "110" have been entered, which looks substantially similar to shadowed scan chain register bank 201 similarly loaded as depicted in FIG. 2B. Likewise, on the next clock cycle composite shadowed scan chain register bank 351 as depicted in FIG. 3E will function in a fashion substantially similar to the functioning of shadowed scan chain register bank 201 as described in FIG. 2C.

As has been shown, the connections shown in FIG. 3B provide the same functionality of the embodiments illustrated in relation to FIGS. 2A, 2B, and 2C. However, the embodiments illustrated in FIGS. 3A, 3B, 3C, 3D, and 3E require no additional registers beyond those already present within an IC under test. Those skilled in the art will recognize that Registers a, b, c, d, e, and f, and the connections associated with such registers, can be implemented utilizing any number of components well known to those within the art, such as virtually any memory elements allowing the sequential application of data (e.g., flop flops, latches, or random access memory sequentially employed) to appropriate inputs of any particular combinational logic circuit under test.

The preceding embodiments have described the use of shadow registers, or registers connected to function as shadow registers, which utilize one shadow register for each register present in a scan chain register bank to be shadowed. In the case of scan chain register banks which have a large number of inputs, it can be seen that the number of shadow registers utilized under the previously described embodiments could become quite large. That is, when many registers affect output Z under the preceding embodiments, many shadow registers have to be interleaved between registers that affect the output Z. Adding new shadow registers may increase the number of registers present substantially. Embodiments will now be described which do not utilize a corresponding shadow register for every single scan chain register present.

Referring now to FIGS. 4–7B, FIGS. 4–7B will be utilized to show embodiments of the present invention which require near minimal numbers of shadow registers to achieve the ability to clock in a change input scan chain pattern utilizing only one clock cycle. In the course of describing FIGS. 4–7B, embodiments will be described which reduce the number of shadow registers by arranging only the registers that affect the output Z.

Figure 4:
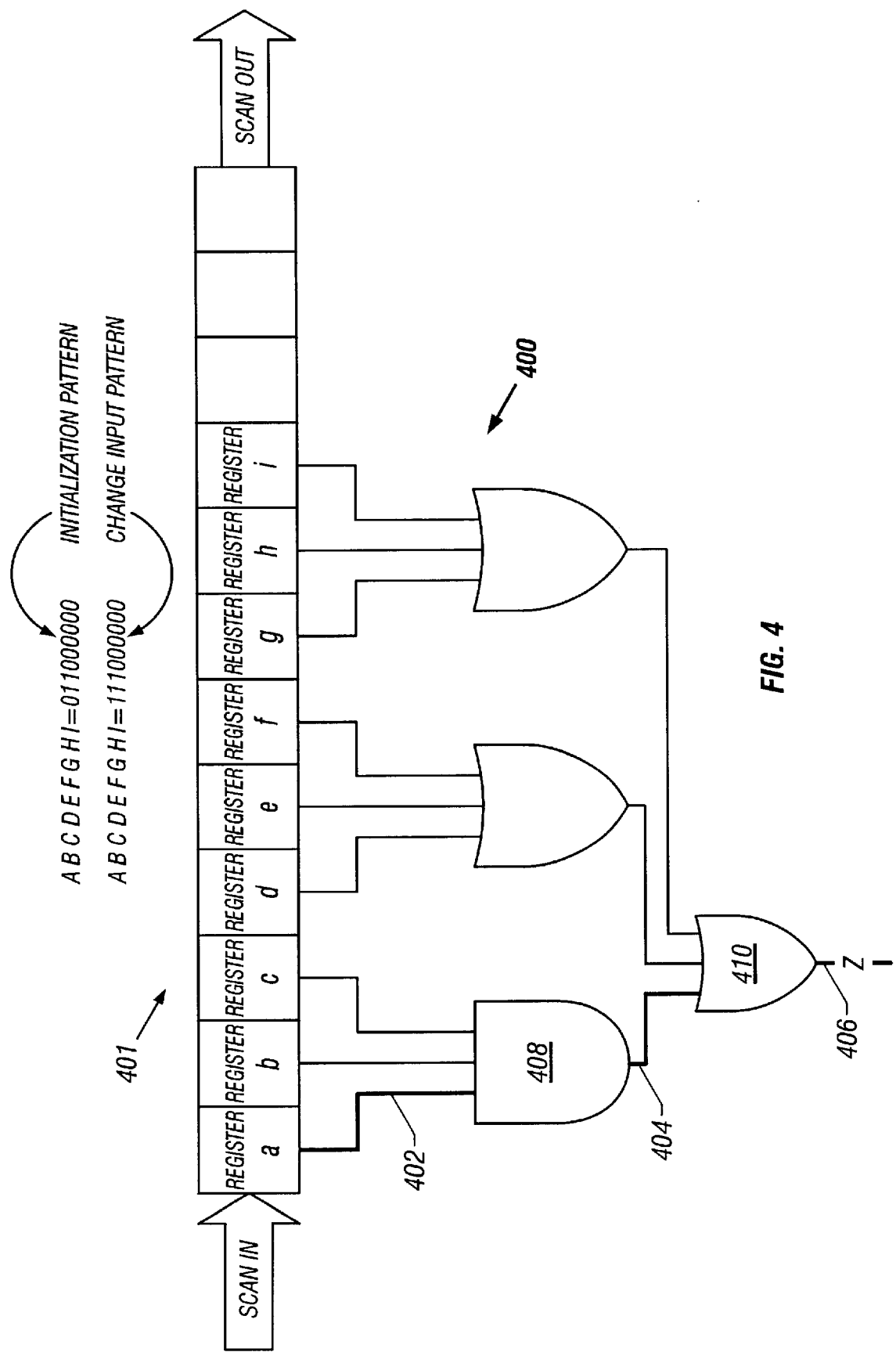
FIGS. 4, 5, 6A, 6B, 7A and 7B illustrate embodiments of the present invention which require near minimal numbers of shadow registers to achieve the ability to clock in a change input scan chain test pattern utilizing only one clock cycle.

With reference now to FIG. 4, shown is a combinational block that depends on many registers. Those skilled in the art will recognize that the output signal Z is generated from the following equation: (output signal Z=input signal a*input signal b*input signal c+input signal d+input signal e+input signal f+input signal g+input signal h+input signal i). In order to test the delay path from input signal a to output signal Z, either of the following two sets of test patterns can be utilized (it will be understood that these two sets of test patterns are exemplary, and that other test pattern sets can be likewise constructed via the use of the principles discussed (i.e., the discussion of controlling and non-controlling inputs) above):

(a) ABCDEFGHI=<initialization test pattern "011000000", and change input test pattern "111000000">, or (b) ABCDEFGHI=<initialization test pattern "111000000", and change input test pattern "011000000">.

Both of the above test pattern sets toggle value "A" while keeping all other register values unchanged. Neither of these test patterns sets, however, can be generated by a one clock cycle shift of the contents of scan chain register bank 401 in the direction shown in FIG. 4.

Shown in FIG. 4 is combinational logic circuit 400. Shown also is scan chain register bank 401 composed of Registers a, b, c, d, e, f, g, h, and i. Assuming test pattern set (a) is to be used to test the delay of combinational logic path 402, 404, 406, in the scenario shown it is apparent that at least 9 rising edge clock cycles must elapse subsequent to the loading of initialization test pattern "011000000" prior to being able to utilize change input test pattern "111000000". Thus, for reasons analogous to those discussed in relation to FIG. 1A, 1B, and 1C, there is no practicable way in the absence of the present invention to use test pattern set "(a)". That is, since scan chain register bank 401 contents are changing on each clock cycle there is no practicable way that test pattern set "(a)" can be utilized since there does not exist any way, under the related art, to practicably allow change input pattern "1110000000" to follow initialization test pattern "011000000".

Figure 5:
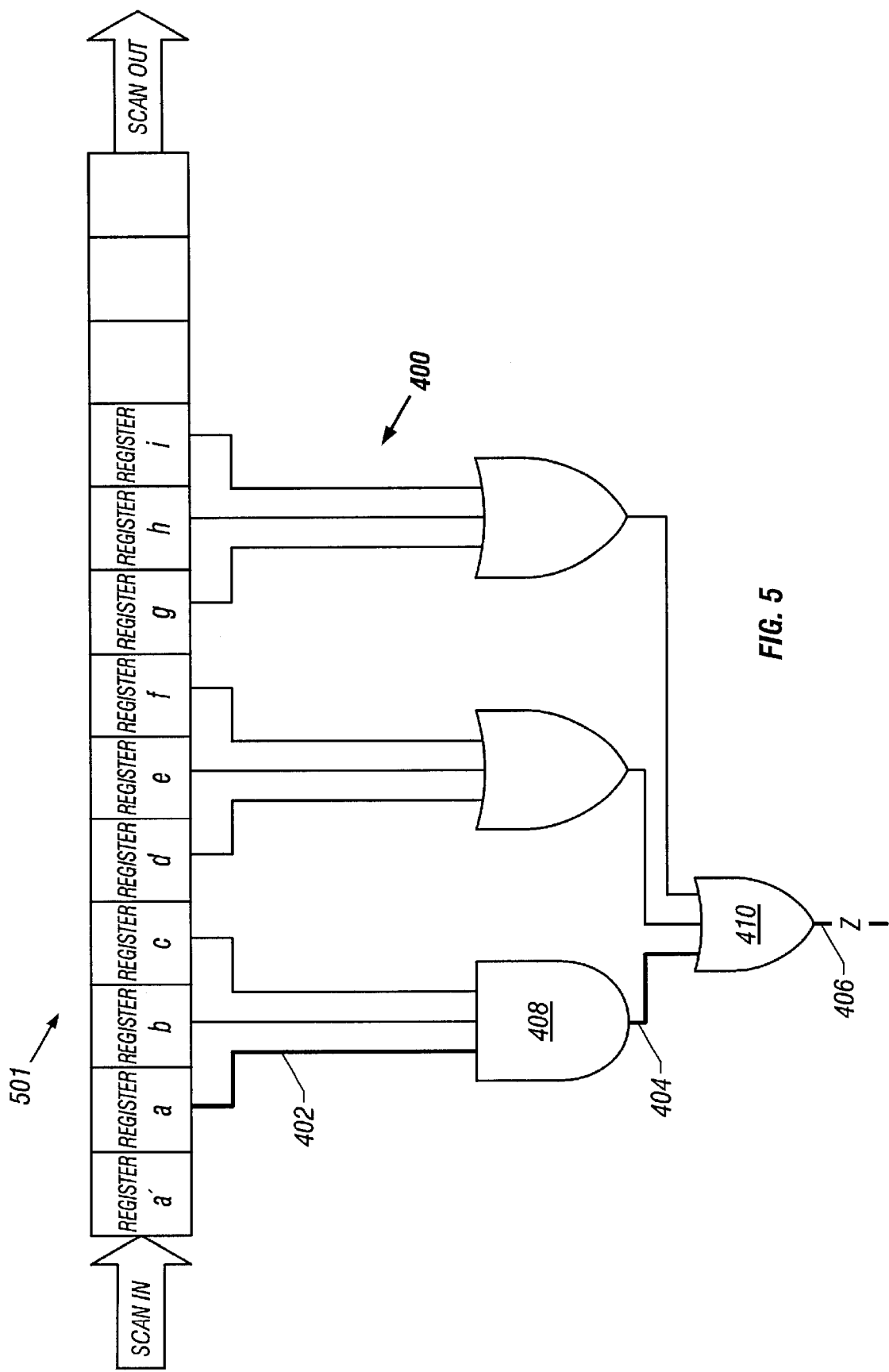

Shown in FIG. 5 is an embodiment of the present invention whereby test pattern "(a)" can be used to construct test patterns composed of a constructed initialization test pattern and a constructed change input test pattern to be scanned into scan chain register bank 501, such that after the constructed initialization test pattern is scanned in, a one bit, or clock cycle, shift will result in the constructed change input test pattern being presented as input to combinational logic circuit 400 of which a path delay is to be tested. The embodiment of FIG. 5 requires only substantially minimal additional shadow registers, and such minimum additional shadow registers may be supplied via the utilization of newly added shadow registers (e.g., analogous to the way shadow registers were supplied in the embodiments of FIGS. 2A, 2B, and 2C) or by utilizing existing scan chain registers (e.g., analogous to the way shadow registers were supplied in the embodiments of FIGS. 3A, 3B, 3C, 3D and 3E).

Figure 6A:
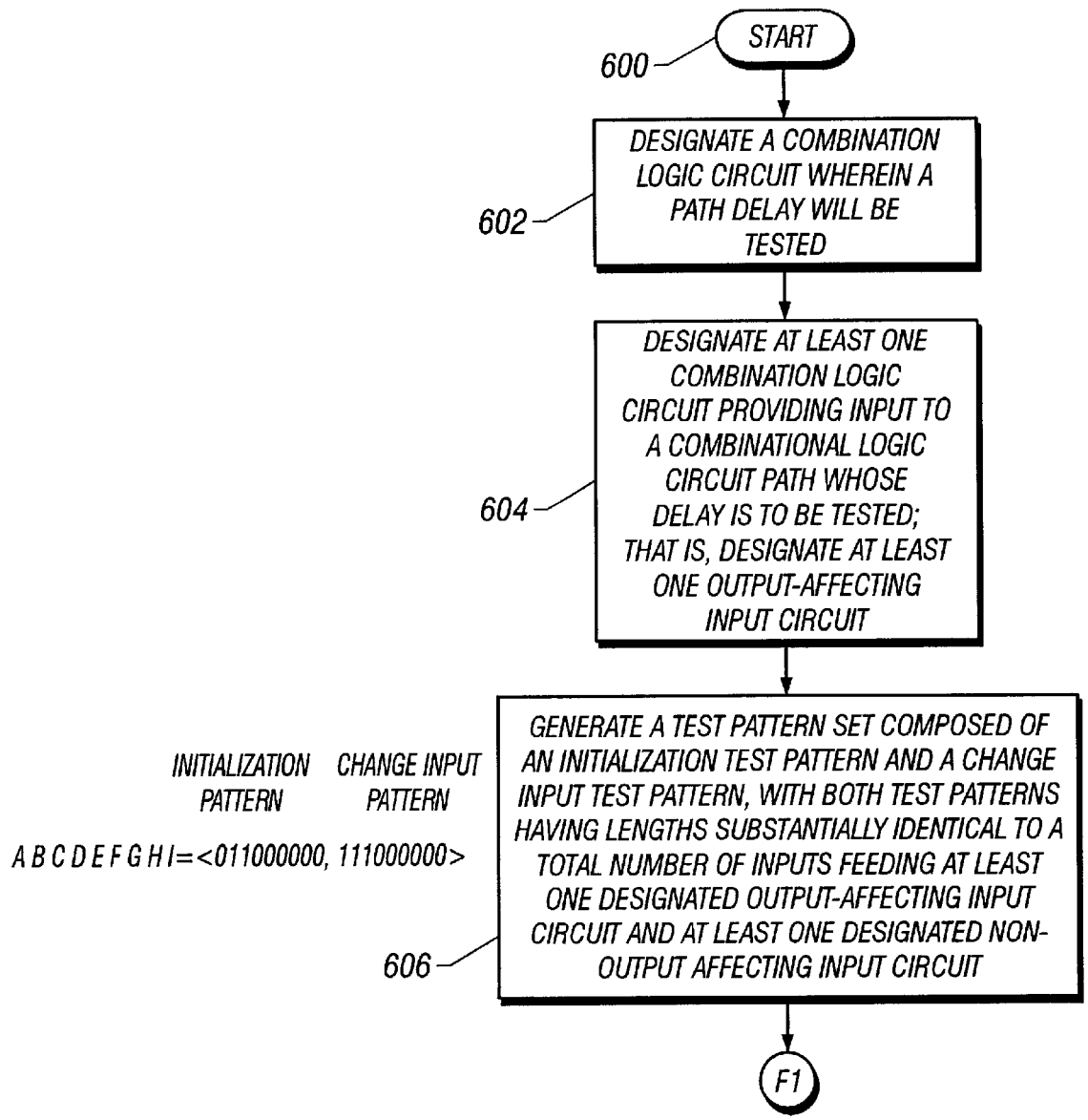
Figure 6B:
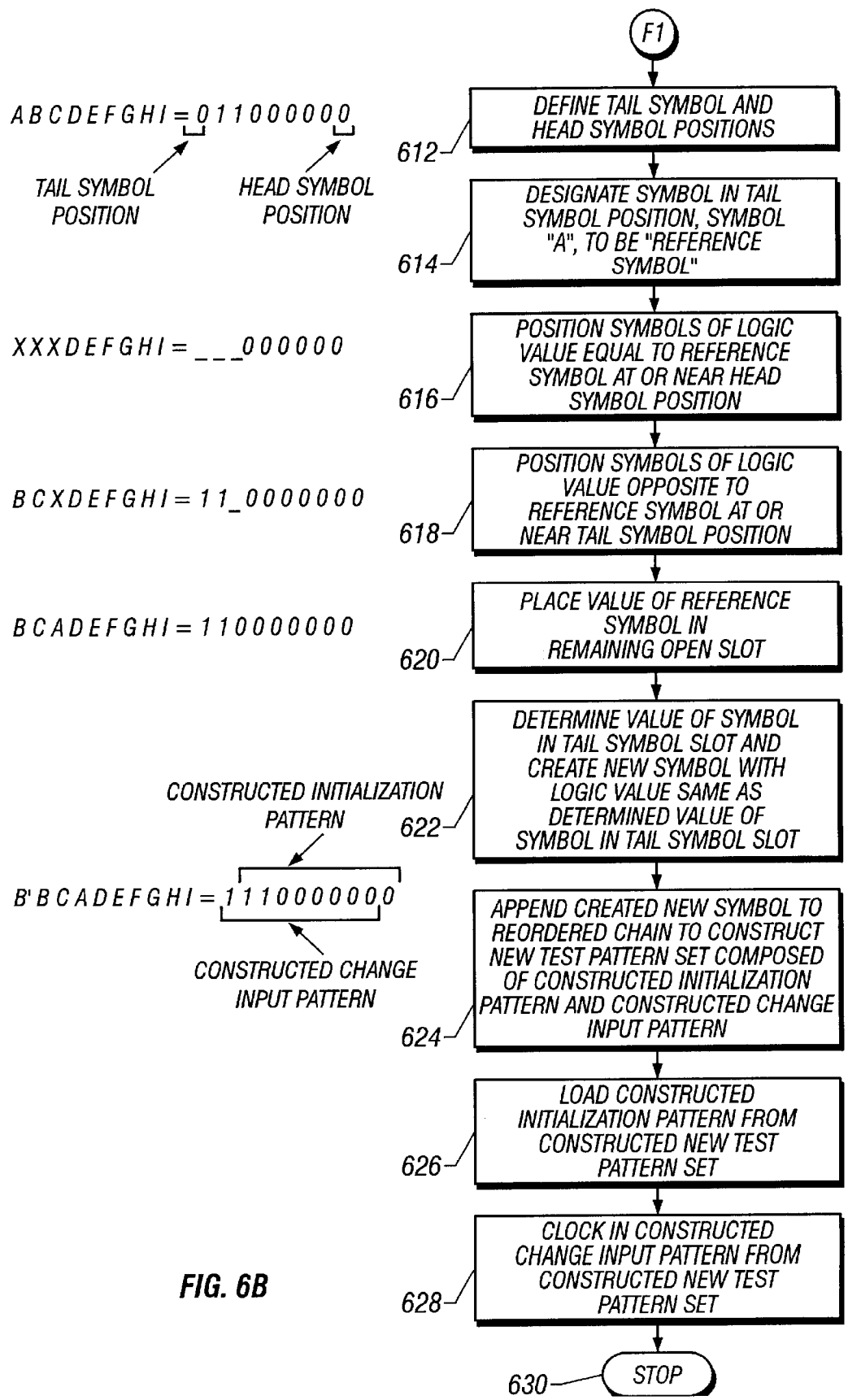

Referring now to FIGS. 6A and 6B, shown is a high-level logic flowchart which illustrates a method to be utilized when a substantially minimal number of shadow registers is required. Method step 600 depicts the start of the process. Method step 602 illustrates the designation of combinational logic circuit (e.g., combinational logic circuit 400) wherein a path delay will be tested, such as the delay on path 402, 404, 406. Method step 604 depicts the designation of at least one logic circuit providing input to a combinational logic circuit path whose delay is to be tested, which will be used to control transitioning of an output signal Z; that is, method step 604 depicts that at least one logic circuit will be designated to be an output-affecting input circuit, such as logic circuit 408. Method step 606 shows the generation of a test pattern set composed of a change input test pattern and an initialization test pattern, with both the change in input and initialization patterns having lengths substantially identical to a total number of inputs feeding at least one designated output-affecting input circuit and at least one designated non-output-affecting input circuit (e.g., test pattern sets similar to either test pattern sets (a), or (b), are generated).

Subsequent to the generation of the test pattern set, a second test pattern set is constructed therefrom, as will be illustrated via method steps 612–628.

Method steps 612–628 depict the rearranging of the entries of the first scan chain test pattern and appending at least one symbol to the rearranged entries of the first scan chain test pattern such that a constructed scan chain test pattern set is produced that has a constructed change input test pattern and a constructed initialization test pattern such that the constructed test patterns can be utilized with scan chain resister bank 501 of FIG. 5 to change a test pattern from an initialization test pattern to a change input test pattern with just a one bit shift.

FIG. 6A depicts initialization pattern of test pattern set (a) to be ABCDEFGHI="011000000" such as that depicted in FIG. 4. Method step 612 depicts designating symbol "I" to be the head symbol position of the scan chain test pattern and designating symbol "A" to be the tail symbol position of the at least a first scan chain—the designations are such that the head symbol "I" position corresponds to a first symbol in the scan chain test pattern that would be clocked in and the tail symbol position "A" corresponds to a last symbol in the scan chain pattern that would be clocked in if initialization pattern (a) were to be clocked into scan chain register bank 401.

Method step 614 depicts designating the symbol that was originally in the tail symbol position (e.g., symbol "A") to be the "reference symbol". Method step 616 illustrates the comparison of the remaining symbols (e.g., symbols "B", "C", "D", "E", "F", "G", "H", "I") against the "reference symbol" and reordering these remaining symbols such that those symbols which are of value substantially equivalent to the reference symbol (e.g., symbols "D", "E", "F", "G", "H", "I") appear either in or substantially proximate to the head of the reordered initialization scan chain. Method step 618 shows that symbols which are of value substantially opposite that of reference symbol (e.g., symbols "B", "C") are reordered to appear either in or substantially proximate to the tail symbol position in the scan chain. Subsequently, method step 620 illustrates placing the reference symbol value (e.g., symbol "A") in the remaining open slot. Method step 622 shows the discernment of the logic value of the symbol which is now in the tail symbol positions (e.g., symbol "B" is in the tail position) and the creation of a new symbol B' which has logic value the same as that of the symbol in the tail symbol position (e.g., B' is the same logic value of symbol B). Method step 624 shows that B' is now appended to the rearranged initialization scan chain to construct a new test pattern set.

Method step 626 depicts that constructed scan chain B'BCADEFGHI is loaded into scan chain register bank 501 such that values BCADEFGHI are in Registers a-f and value B' appears in shadow Register a'. Method step 628 shows that on the next clock cycle, the appended value B' is clocked into scan chain register bank 501 which will then result in B'BCADEFGH appearing in Registers a-f, and thus force a change in output signal Z. Method step 630 shows the end of the process.

As can be seen, the foregoing described method depicts that even though the scan chain test pattern is 9 symbols long, an embodiment of the present invention can be achieved by the addition of only one shadow register sufficient to accommodate B'. This is because the foregoing method constructed an initialization pattern BCADEFGHI and a change input test pattern B'BCADEFGH which can be applied in one clock cycle subsequent to the application of the initialization pattern.

It will also be understood by those skilled in the art that an alternate embodiment could be achieved by clocking constructed initialization pattern BCADEFGHI into scan chain register bank 401 and subsequently clocking B' into scan chain register bank 401.

It will also be understood by those skilled in the art that the manipulation shown in the high level logic flowchart of FIG. 6 can be achieved by hardware design within the IC via the use of techniques will understood by those within the art.

Figure 7A:
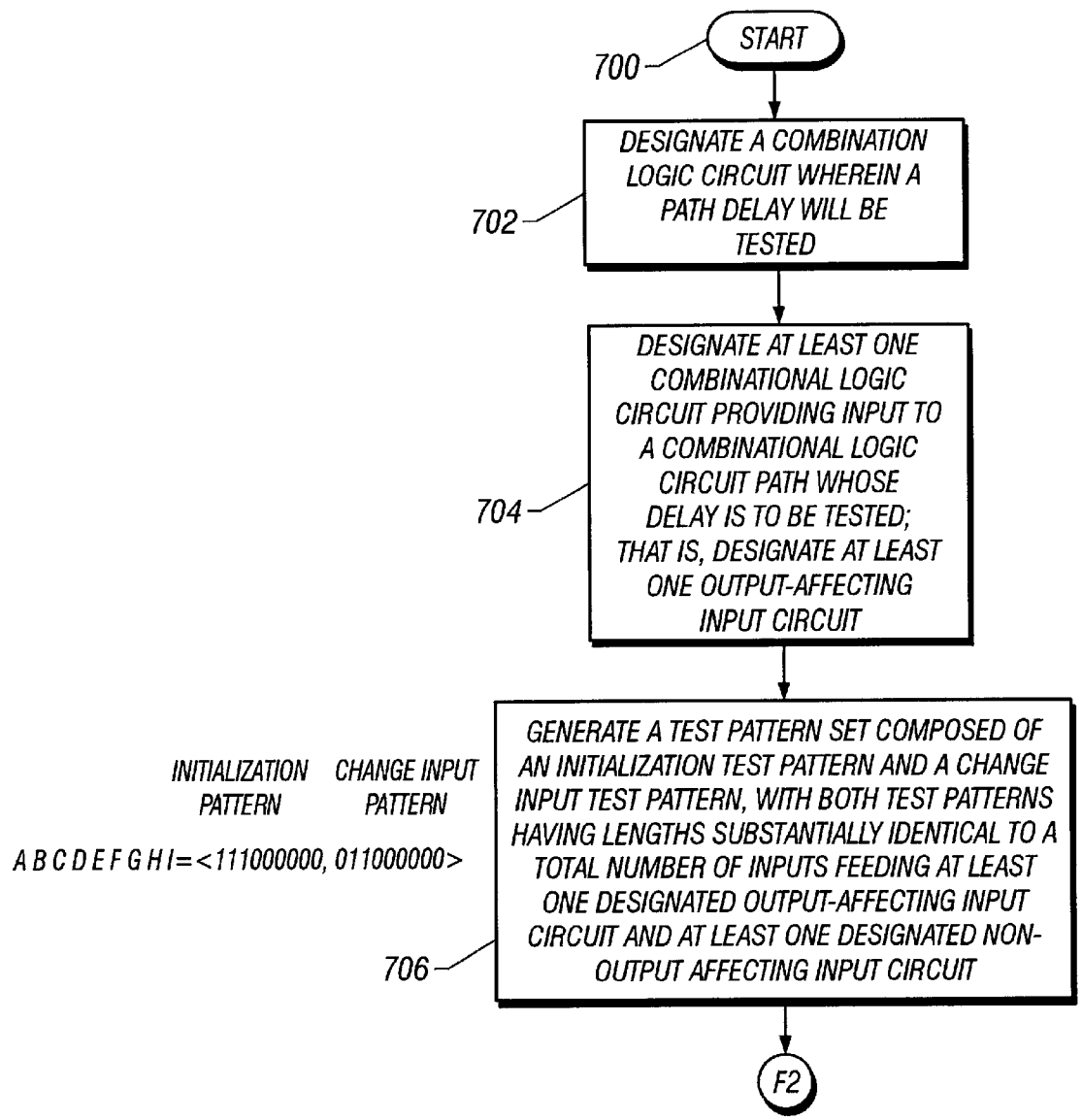
Figure 7B:
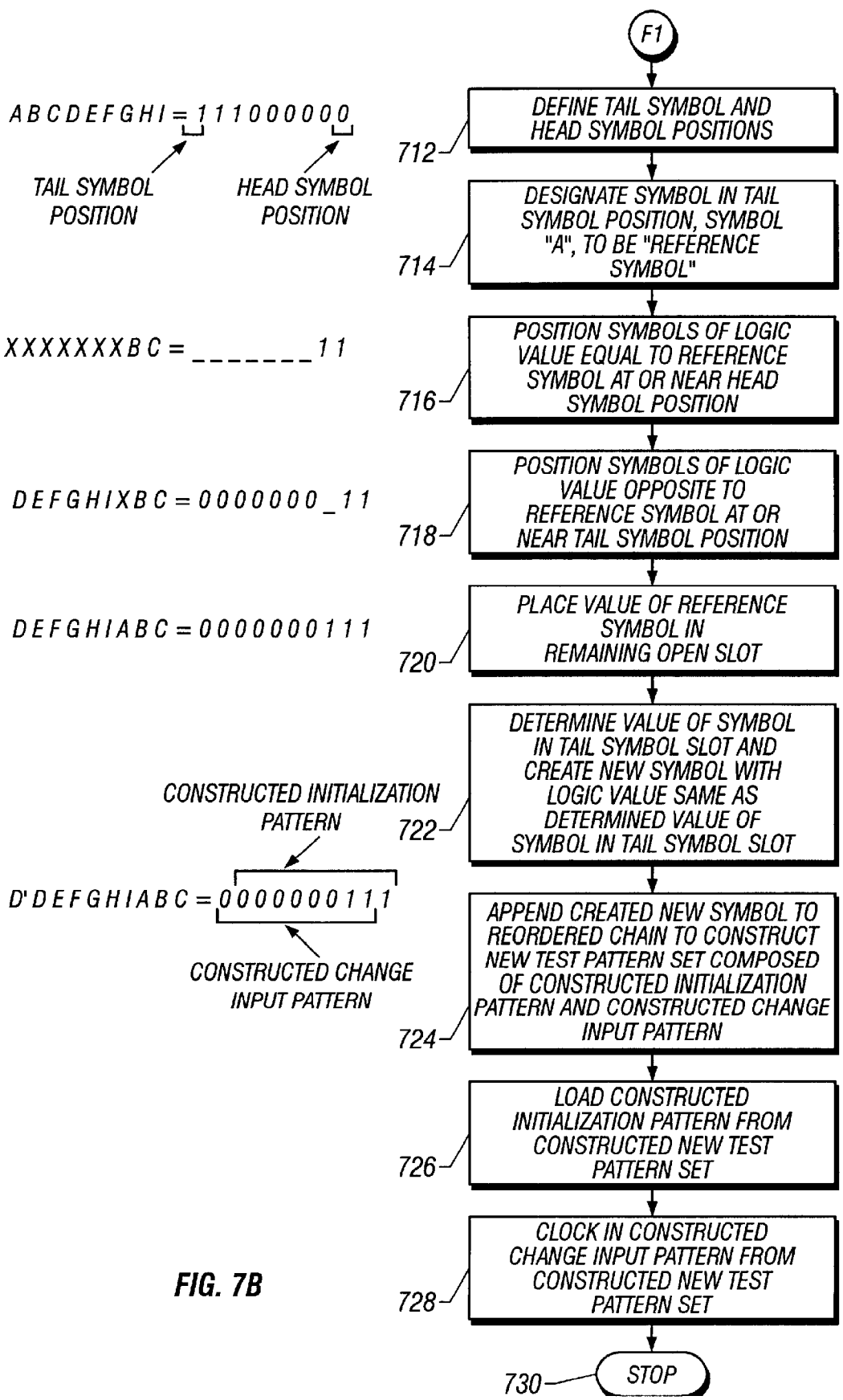

Finally, FIGS. 7A–7B present a high level logic flowchart geared to constructing a test pattern set based on test pattern (b) (i.e., ABCDEFGHI=<111000000,011000000>). This flowchart functions, and is used in substantially the same way, as that described in relation to the high-level logic flowchart of FIG. 6, with the seven hundred series numbered blocks functioning substantially similar to their seven hundred series counterparts.

Referring now to FIGS. 7A and 7B, shown is a high-level logic flowchart which illustrates a method to be utilized when a substantially minimal number of shadow registers is required. Method step 700 depicts the start of the process. Method step 702 illustrates the designation of combinational logic circuit (e.g., combinational logic circuit 400) wherein a path delay will be tested, such as the delay on path 402, 404, 406. Method step 704 depicts the designation of at least one logic circuit providing input to a combinational logic circuit path whose delay is to be tested, which will be used to control transitioning of an output signal Z; that is, method step 704 depicts that at least one logic circuit will be designated to be an output-affecting input circuit, such as logic circuit 408. Method step 706 shows the generation of a test pattern set composed of a change input test pattern and an initialization test pattern, with both the change in input and initialization patterns having lengths substantially identical to a total number of inputs feeding at least one designated output-affecting input circuit and at least one designated non-output-affecting input circuit (e.g., test pattern sets similar to either test pattern sets (a), or (b), are generated).

Subsequent to the generation of the test pattern set, a second test pattern set is constructed therefrom, as will be illustrated via method steps 712–728.

Method steps 712–728 depict the rearranging of the entries of the first scan chain test pattern and appending at least one symbol to the rearranged entries of the first scan chain test pattern such that a constructed scan chain test pattern set is produced that has a constructed change input test pattern and a constructed initialization test pattern such that the constructed test patterns can be utilized with scan chain resister bank 501 of FIG. 5 to change a test pattern from an initialization test pattern to a change input test pattern with just a one bit shift.

FIG. 7A depicts initialization pattern of test pattern set (a) to be ABCDEFGHI="111000000". Method step 712 depicts designating symbol "I" to be the head symbol position of the scan chain test pattern and designating symbol "A" to be the tail symbol position of the at least a first scan chain—the designations are such that the head symbol "I" position corresponds to a first symbol in the scan chain test pattern that would be clocked in and the tail symbol position "A" corresponds to a last symbol in the scan chain pattern that would be clocked in if initialization pattern (a) were to be clocked into scan chain register bank 401.

Method step 714 depicts designating the symbol that was originally in the tail symbol position (e.g., symbol "A") to be the "reference symbol". Method step 716 illustrates the comparison of the remaining symbols (e.g., symbols "B", "C", "D", "E", "F", "G", "H", "I") against the "reference symbol" and reordering these remaining symbols such that those symbols which are of value substantially equivalent to the reference symbol (e.g., symbols "B", "C") appear either in or substantially proximate to the head of the reordered initialization scan chain. Method step 718 shows that symbols which are of value substantially opposite that of reference symbol (e.g., symbols "D", "E", "F", "G", "H", "I") are reordered to appear either in or substantially proximate to the tail symbol position in the scan chain. Subsequently, method step 720 illustrates placing the reference symbol value (e.g., symbol "A") in the remaining open slot. Method step 722 shows the discernment of the logic value of the symbol which is now in the tail symbol positions (e.g., symbol "D" is in the tail position) and the creation of a new symbol D' which has logic value the same as that of the symbol in the tail symbol position (e.g., D' is the same logic value of symbol D). Method step 724 shows that D' is now appended to the rearranged initialization scan chain to construct a new test pattern set.

Method step 726 depicts that constructed scan chain D'DEFGHIABC is loaded into scan chain register bank 501 such that values DEFGHIABC are in Registers a-f and value D' appears in shadow Register a'. Method step 728 shows that on the next clock cycle, the appended value D' is clocked into scan chain register bank 501 which will then result in D'DEFGHIAB appearing in Registers a-f, and thus force a change in output signal Z. Method step 730 shows the end of the process.

The foregoing detailed description has set forth various embodiments of the present invention via the use of block diagrams, pictographic representations, flowcharts and examples. It will be understood as notorious by those within the art that each component, step, and operation illustrated by the use of block diagrams, pictographic representations, and examples can be implemented, individually and/or collectively, by a wide range of hardware, software, firmware, or any combination thereof In one embodiment, the present invention is implemented via Application Specific Integrated Circuits (ASICS). However, those skilled in the art will recognize that the embodiments disclosed herein, in whole or in part, can be equivalently implemented in standard Integrated Circuits, as a computer program running on a computer or processor, as firmware, or as virtually any combination thereof and that designing the circuitry and/or writing the code for the software or firmware would be well within the skill of one of ordinary skill in the art in light of this specification.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

The foregoing described embodiments depict different components contained within, or connected with, different other components. It is to be understood that such depicted architectures are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For non-limiting example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles used to introduce claim elements.

What is claimed is:

1. A method comprising:
    applying a resultant test pattern to at least one combinational logic circuit;
    wherein the resultant test pattern is generated by:
        generating an initialization test pattern;
        generating a change test pattern;
        designating a symbol in the initiation test pattern as a reference symbol;

generating a reordered initialization test pattern, the generating the reordered initialization test pattern including reordering a sequence of symbols, other than the reference symbol, of the initialization test pattern such that those symbols which are of a value substantially equivalent to a value of the reference symbol appear either in or in slots substantially proximate to a first symbol position slot and such that those symbols which are of a value substantially opposite the value of the reference symbol appear either in or in slots substantially proximate a second symbol position slot.

2. The method of claim 1 wherein the first symbol position slot is a head symbol position slot and the second symbol position slot is a tail symbol position slot.

3. The method of claim 2 wherein the reordered initialization test pattern is further generated by:

placing the reference symbol in a slot between the head symbol position slot and the tail symbol position slot.

4. The method of claim 1 wherein the symbol in the initiation test pattern designated as a reference symbol is a symbol in a tail position slot of the initiation test pattern.

5. The method of claim 1 wherein the reordered initialization test pattern is further generated by:

placing a symbol having the value of the reference symbol in a slot between the first symbol position slot and the second symbol position slot.

6. The method of claim 1 wherein the resultant test patent is further generated by:

appending at least one symbol to the reordered initiation test pattern.

7. The method of claim 6 wherein the at least one symbol is appended to a tail symbol position slot of the reordered initialization test pattern.

8. The method of claim 7 further wherein the change test pattern and the initialization test pattern are generated such that each has a length substantially identical to a total number of inputs to at least one designated output-affecting input circuit and at least one designated non-output-affecting input circuit.

9. The method of claim 8, wherein the generating the change test pattern and the initialization test pattern such that each has a length substantially identical to a total number of inputs to at least one designated output-affecting input circuit and at least one designated non-output-affecting input circuit further includes:

generating the change test pattern and the initialization test pattern such that the change test pattern and the initialization test pattern have substantially identical entries corresponding to inputs of the at least one non-output-affecting input circuit and substantially different entries corresponding to inputs of the at least one output-affecting input circuit.

10. The method of claim 9, wherein the applying the resultant test pattern to the at least one combinational logic circuit further includes:

loading the resultant test pattern into a register bank operatively connected to the at least one combinational logic circuit.

11. The method of claim 1 wherein the resultant test pattern includes the reordered initialization test pattern and a reordered change test pattern, wherein the applying the resultant test pattern to the at least one combinational logic circuit further includes:

applying the reordered initialization test pattern to inputs of the at least one combinational logic circuit; and applying the reordered change test pattern to the inputs of the at least one combinational logic circuit in a next clock cycle after the reordered initialization test pattern was applied to the combinational logic circuit.

12. An apparatus comprising:

a combinational logic circuit;

means for providing to the combinational logic, a resultant test pattern that includes a reordered initialization test pattern, the reordered initialization patent being generated from an initiation test pattern having a designated reference symbol, the reordered initialization test pattern being generated by reordering a sequence of symbols, other than the reference symbol, of the initialization test pattern such that those symbols which are of a value substantially equivalent to a value of the reference symbol appear either in or in slots substantially proximate to a first symbol position slot and such that those symbols which are of a value substantially opposite the value of the reference symbol appear either in or in slots substantially proximate a second symbol position slot.

13. The apparatus of claim 12 wherein the first symbol position slot is a head symbol position slot and the second symbol position slot is a tail symbol position slot.

14. The apparatus of claim 12 wherein the symbol in the initiation test pattern designated as a reference symbol is a symbol in a tail position slot of the initiation test pattern.

15. The apparatus of claim 12 wherein the reordered initialization test pattern is further generated by placing a symbol having the value of the reference symbol in a slot between the first symbol position slot and the second symbol position slot.

16. The apparatus of claim 12 wherein the reordered initialization test pattern is further generated by placing the reference symbol in a slot between a head symbol position slot and a tail symbol position slot.

17. The apparatus of claim 12 wherein the resultant test patent is further generated by appending at least one symbol to the reordered initiation test pattern.

18. The apparatus of claim 17 wherein the at least one symbol is appended to the tail symbol position slot of the reordered initialization test pattern.

19. The apparatus of claim 18 further wherein:

the resultant test pattern includes the reordered initialization test pattern and a reordered change test pattern;

the combinational logic circuit further includes at least one designated output-affecting input circuit and at least one designated non-output-affecting input circuit;

wherein the reordered change test pattern and the reordered initialization test pattern each has a length substantially identical to a total number of inputs to the at least one designated output-affecting input circuit and the at least one designated non-output-affecting input circuit.

20. The apparatus of claim 19, wherein the reordered change test pattern and the reordered initialization test pattern each has a length substantially identical to a total number of inputs to the at least one designated output-affecting input circuit and the at least one designated non-output-affecting input circuit.

21. The apparatus of claim 20 wherein the reordered change test pattern and the reordered initialization test pattern have substantially identical entries corresponding to inputs of the at least one non-output-affecting input circuit and substantially different entries corresponding to inputs of the at least one output-affecting input circuit.

22. The apparatus of claim 20 further comprising:

a register bank operatively connected to the combinational logic circuit, wherein the resultant test pattern is provided to the combinational logic circuit by loading the resultant test pattern into a register bank.

23. The apparatus of claim 12 wherein the resultant test pattern includes the reordered initialization test pattern and a reordered change test pattern, wherein the reordered initialization test pattern is applied to inputs of the combinational logic circuit and the reordered change test pattern is applied to the inputs of the combinational logic circuit in a next clock cycle after the reordered initialization test pattern was applied to the combinational logic circuit.

24. An apparatus comprising:

at least one register bank;

a combinational logic circuit having inputs to receive signals from the at least one register bank;

wherein the at least one registered bank is configured to provide to the combinational logic circuit a resultant test pattern that includes a reordered initialization test pattern and a reordered change test pattern, the reordered initialization test pattern being generated from an initiation test pattern having a designated reference symbol in a tail symbol position slot of the initialization test pattern, the reordered initialization test pattern being generated by reordering a sequence of symbols, other than the reference symbol, of the initialization test pattern such that those symbols which are of a value substantially equivalent to a value of the reference symbol appear either in or in slots substantially proximate to a head symbol position slot and such that those symbols which are of a value substantially opposite the value of the reference symbol appear either in or in slots substantially proximate a tail symbol position slot, wherein the reference symbol is placed in a slot between the head symbol position slot and the tail symbol position slot of the reordered initialization test pattern.

25. The apparatus of claim 24 wherein the reordered change test pattern includes at least one symbol appended to the tail symbol position slot of the reordered initialization test pattern.

26. The apparatus of claim 24 wherein the reordered initialization test pattern is applied to inputs of the combinational logic circuit and the reordered change test pattern is applied to the inputs of the combinational logic circuit in a next clock cycle after the reordered initialization test pattern was applied to the inputs of the combinational logic circuit.

* * * * *